United States Patent [19]
Takahashi et al.

[11] Patent Number: 5,347,587
[45] Date of Patent: Sep. 13, 1994

[54] SPEAKER DRIVING DEVICE

[75] Inventors: Ryutaro Takahashi; Toru Hayase; Kunihiko Ohbayashi, all of Higashihiroshima, Japan

[73] Assignee: Sharp Kabushiki Kaisha, Osaka, Japan

[21] Appl. No.: 956,358

[22] Filed: Oct. 5, 1992

[30] Foreign Application Priority Data

Nov. 20, 1991 [JP] Japan .................. 3-304571
Nov. 22, 1991 [JP] Japan .................. 3-307351

[51] Int. Cl.$^5$ .............................. H04R 3/00
[52] U.S. Cl. ........................ 381/117; 381/111
[58] Field of Search ............. 381/117, 116, 111; 307/262; 340/384 R

[56] References Cited

U.S. PATENT DOCUMENTS

| | | | |
|---|---|---|---|
| 4,360,707 | 11/1982 | Joseph et al. | 381/117 |
| 5,051,799 | 9/1991 | Paul et al. | |
| 5,079,551 | 1/1992 | Kimura et al. | 375/28 |

FOREIGN PATENT DOCUMENTS

| | | | |
|---|---|---|---|
| 56-153841 | 11/1981 | Japan . | |
| 57-17696 | 10/1982 | Japan . | |
| 0003392 | 1/1983 | Japan | 381/117 |
| 2-24119 | 2/1990 | Japan . | |
| 14810081 | 7/1977 | United Kingdom . | |
| 2089171 | 11/1980 | United Kingdom . | |

OTHER PUBLICATIONS

"Possibility for Developing PCM Digital Speaker" (JAS Journal, Jan. 1982, Japan).

Primary Examiner—Curtis Kuntz
Assistant Examiner—Ping W. Lee
Attorney, Agent, or Firm—Nixon & Vanderhye

[57] ABSTRACT

A speaker driving device applies a constant voltage of a constant voltage source to a pair of voice coils alternatively by switching the direction of applying the constant voltage based on a binary PDM signal. A $\Delta\Sigma$ modulator produces the binary PDM signal by $\Delta\Sigma$-modulating a digital audio signal from a digital low-pass filter. The constant voltage is applied to a first voice coil in one direction and is applied to a second voice coil in the reverse direction by switching the direction of applying the constant voltage. The first and second voice coils forms the pair of voice coils. This arrangement causes a current to flow through the first and second voice coils in opposite directions and a diaphragm of a speaker to be driven in two directions opposite to each other. As a result, the speaker is driven more efficiently. Moreover, since the switching of the direction of applying the constant voltage is performed by changing the connections between the constant voltage source and the pair of voice coils, a switching circuit with a simplified structure is used.

18 Claims, 9 Drawing Sheets

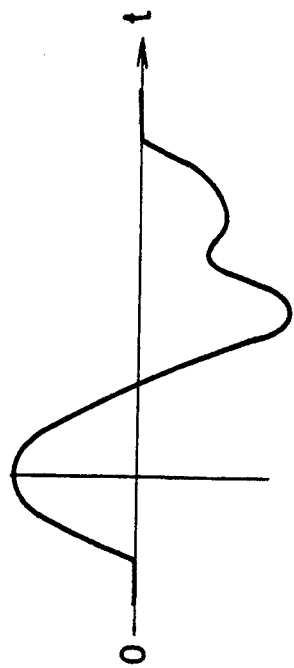
FIG.9(a) ORIGINAL ANALOG AUDIO SIGNAL
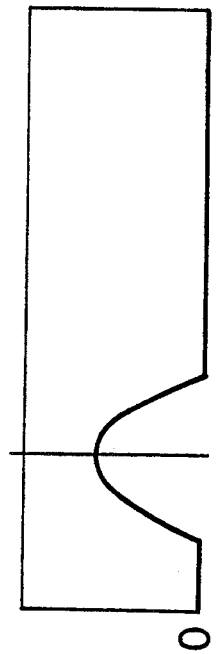
FIG.9(b) POSITIVE RECTIFIED SIGNAL
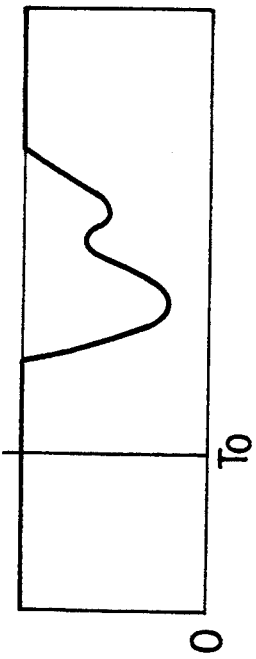
FIG.9(c) NEGATIVE RECTIFIED SIGNAL

SPEAKER DRIVING DEVICE

FIELD OF THE INVENTION

The present invention relates to a speaker driving device which drives a speaker by controlling a constant voltage according to a digital audio signal.

BACKGROUND OF THE INVENTION

In a conventional reproduction system, when reproducing a digital audio signal, the digital audio signal is converted into an analog audio signal, amplified to a variable output level, and is then transmitted to the speaker. However, with the dissemination of digital audio technology, in recent years, techniques for driving a speaker without converting a digital audio signal into an analog signal have developed.

For example, one of the techniques uses a so-called pulse-density modulated one-bit binary digital signal which is produced by a high-speed sampling technique such as $\Delta\Sigma$ modulation. In this technique, according to a binary number (1 or 0) of the one-bit digital signal, the flow of a driving current to a speaker is started or stopped, or the flowing direction of the driving current is switched.

The frequency that a binary signal has a value or 1 varies depending on the amplitude of an original audio signal. This feature is discussed in detail below with reference to FIG. 10.
 a) When the level of the original audio signal exceeds zero, the binary signal tends to have a value 1.
 b) When the level of the original audio signal is zero, the binary signal has a value 0 at the same frequency as it has a value 1.
 c) When the level of the original audio signal is below zero, the binary signal tends to have a value 0.

When reproducing an analog audio signal whose signal level exceeds zero and falls below zero, if the speaker driving device is arranged to stop the flow of a driving current when the binary signal is 0 and to start flow of the driving current when the binary signal is 1, only a driving force which can drive the speaker in one direction is generated, resulting in poor driving efficiency. To overcome such a drawback, the speaker must be driven in directions corresponding to the positive and negative levels of the original analog audio signal by causing a driving current to have a bias.

In the meantime, the speaker driving device which drives a speaker by switching the flowing direction of a driving current is capable of driving the speaker in a plurality of directions. However, to start the flow of a driving current to a conventional voice coil by switching its flowing direction, a complicated switching circuit is required.

Moreover, in a system where a power for driving a speaker is produced based on a one-bit digital audio signal, when a voltage to be applied to the voice coil fluctuates and includes noise components, the fluctuation and noise components directly affects the speaker driving force. This may cause distortion and noise in the reproduced sound.

Additionally, with the speaker driving device which stops or starts the flow of a driving current according to a binary signal, when the level of the original analog signal is 0, the possibility that the driving current flows to a speaker is about 50% due to the feature of the binary signal as stated in b), resulting in poor power efficiency.

Similarly, the speaker driving device which drives a speaker by switching the flowing direction of a driving current has the following problems due to the feature of a binary signal. For example, if the driving current is arranged to flow in a specific direction when the binary signal has a value 1 and to flow in the opposite direction when the binary signal has a value 0, the driving current always flows in one of the two directions to the speaker when the level of the original analog signal is 0. This arrangement also significantly lowers the power efficiency.

SUMMARY OF THE INVENTION

The present invention is directed to a speaker driving device for driving a speaker according to a one-bit digital audio signal and the objectives thereof are as follows.

Namely, an objective of the present invention is to provide a speaker driving device which has a simplified structure but drives a speaker efficiently. Another objective is to provide a speaker driving device which prevents fluctuation in a voltage applied to a voice coil from causing distortion and noise in the reproduction of sound. Still another objective of the present invention is to provide a power efficient speaker driving device.

To achieve the objective, a speaker driving device of the present invention includes: a pair of voice coils which are wound around the driving section of a speaker such that a bi-directional driving force is generated at the driving section when a current flows through in two opposite directions; a constant-voltage source for generating a constant voltage; $\Delta\Sigma$ modulating means for producing a one-bit binary digital audio signal by high-speed sampling $\Delta\Sigma$-modulating; and first switching means for applying the constant voltage to one of the voice coils so as to cause the current to flow through the voice coils in the opposite directions by switching the direction of the constant voltage based on the one-bit digital audio signal.

The $\Delta\Sigma$ modulating means is a $\Delta\Sigma$ modulator for $\Delta\Sigma$-modulating a PCM digital audio signal or a one-bit A/D converter for converting an analog audio signal into a digital audio signal by the $\Delta\Sigma$-modulation method.

In this speaker driving device, the $\Delta\Sigma$ modulating means converts a PCM digital audio signal or an analog audio signal into a one-bit binary digital audio signal, and then the first switching means operates based on the one-bit digital audio signal.

For example, if the constant voltage is applied to one of the voice coils when the one-bit digital audio signal is 1, a driving current flows through the voice coil. On the other hand, if the constant voltage is applied to the other voice coil when the one-bit digital audio signal is 0, the driving current flows through the voice coil in the opposite direction.

As a result, the driving section of the speaker is driven in directions corresponding to the positive and negative levels of the original audio signal. This arrangement thus achieves improved driving efficiency in comparison with that of a speaker driving device which can drive its driving section only in one direction. Additionally, since the voice coils are fixed around the driving section of the speaker such that the driving current flows through each coil in the opposite direction, the first switching means is formed by a plain switch capable of switching the connections between the constant-voltage source and the voice coils.

To achieve another objective, a speaker driving device of the present invention includes: a pair of voice coils which are fixed around the driving section of a speaker such that a bi-directional driving force is generated at the driving section when a current flows in two opposite directions; a constant-voltage source for generating a constant voltage; direct current blocking means for blocking the direct current component of the constant voltage; $\Delta\Sigma$ modulating means for producing a one-bit binary digital audio signal by high-speed sampling $\Delta\Sigma$-modulation; and second switching means for selectively applying the constant voltage to one of the voice coils and applying the output voltage of the direct current blocking means to the other voice coil based on the one-bit digital audio signal so as to cause the current to flow through the voice coils in the opposite directions.

Similarly to the above-mentioned speaker driving device, in this speaker driving device, a one-bit binary digital audio signal is produced by the $\Delta\Sigma$ modulating means and the second switching means operates based on the one-bit digital audio signal.

Denoting the pair of voice coils as first and second voice coils, if the constant voltage is applied to the first voice coil when the one-bit digital audio signal is, for example, 1, a driving current flows to the first voice coil. When a driving force produced by the driving current is applied to the driving section of the speaker, the speaker is driven.

At this time, the direct current blocking means blocks the direct current component of the constant voltage while allowing the alternating current component which fluctuates and includes noise components to pass. When the alternating current component is sent to the second voice coil, a current (hereinafter referred to as noise current) flows through the second voice coil. When a driving force produced by the noise current is applied to the driving section of the speaker, the speaker is driven in a direction opposite to the direction in which the above-mentioned driving force drives the speaker. Consequently, the driving force generated by the noise current is offset, preventing the fluctuation and noise components in the constant voltage from affecting the driving of the speaker.

In contrast, if the constant voltage is applied to the second voice coil when the one-bit digital audio signal is 0, the driving current flows through the second voice coil. Then, a driving force produced by the driving current is applied to the driving section of the speaker to drive the speaker. The direct current blocking means blocks the direct current component of the constant voltage while allowing the alternating current component to pass to the first voice coil in the manner as described above. As a result, the noise current flows through the first voice coil. A driving force generated by the noise current is applied to the driving section of the speaker. Thus, the driving force generated by the noise current is offset, preventing the fluctuation and noise components in the constant voltage from affecting the driving of the speaker.

To achieve still another objective, a speaker driving device of the present invention includes: a constant-voltage source for generating a constant voltage to be applied to a voice coil in a speaker; $\Delta\Sigma$ modulating means for producing a one-bit binary digital audio signal by high-speed sampling $\Delta\Sigma$-modulation; ternary signal generating means for converting the one-bit digital audio signal into a ternary signal; and third switching means for switching the polarity of the constant voltage depending on whether the ternary signal is $+1$ or $-1$ and for controlling the application of the constant voltage to the voice coil by switching the constant-voltage source between ON and OFF according to an absolute value, 0 or 1, of the ternary signal.

In this speaker driving device, the ternary signal generating means converts the one-bit binary digital audio signal generated by the $\Delta\Sigma$ modulating means into a ternary signal and the third switching means operates according to the ternary signal.

For example, when the ternary signal has a value $+1$, a positive constant voltage is applied to the voice coil such that a driving current flows in the positive direction to the voice coil. On the other hand, when the ternary signal has a value $-1$, a negative constant voltage is applied to the voice coil such that the driving current flows in the negative direction to the voice coil. In both cases, the absolute value of the ternary signal is 1 and the output of the constant-voltage source is turned ON. Meanwhile, when the ternary signal has a value 0, its absolute value is 0 and the output of the constant-voltage source is turned OFF. Consequently, the driving current does not flow through the voice coil.

With this arrangement, the diaphragm of the speaker is driven in proportion to an analog audio signal. At this time, since the diaphragm functions as an acoustic low-pass filter, the speaker is driven according to the ternary signal. Additionally, this arrangement improves the power efficiency by stopping the flow of the driving current to the voice coil when the ternary signal has a value 0. Furthermore, since two directional driving force corresponding to $+1$ and $-1$ of the ternary signal is generated, the speaker is driven more efficiently.

For a fuller understanding of the nature and advantages of the invention, reference should be made to the ensuing detailed description taken in conjunction with the accompanying drawings.

BRIEF DESCRIPTION OF THE DRAWINGS

FIGS. 9(a), 9(b) and 9(c) illustrate the waveforms of an original analog audio signal and the positive and negative rectified signals of the original audio signal to be converted into a binary signal by the speaker driving device shown in FIG. 6.

DESCRIPTION OF THE EMBODIMENTS

The first embodiment of the present invention is described below with reference to FIGS. 1, 2 and 4.

Figure 1:
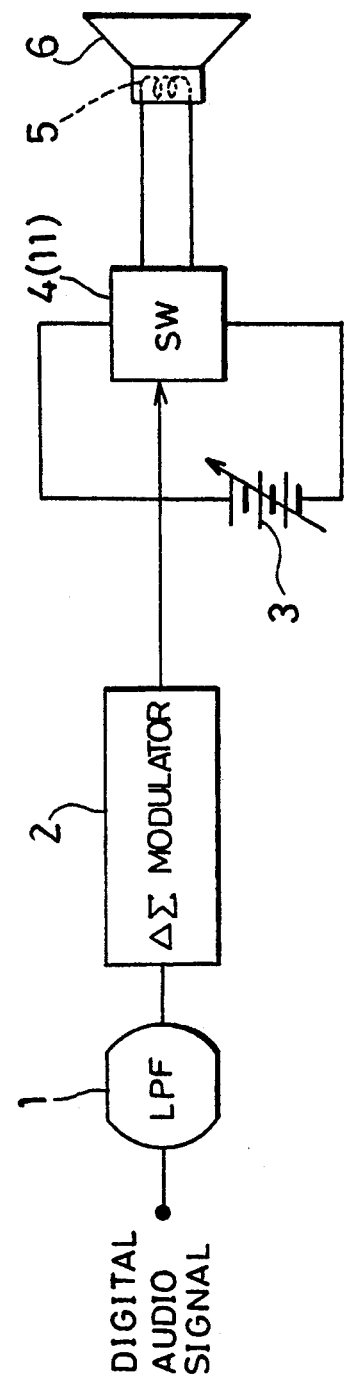
FIG. 1 is a block diagram schematically illustrating the structure of a speaker driving device according to the first and second embodiments of the present invention.

As illustrated in FIG. 1, a speaker driving device of this embodiment includes a digital low-pass filter (LPF) 1, a $\Delta\Sigma$ modulator 2, a constant voltage source 3, a switching circuit 4 and a voice coil 5.

The digital low pass filter 1 is constituted by, for example, a high-order non-cyclic (FIR type) digital filter and executes over-sampling by attenuating components outside the pass band. Sample values are produced at a high frequency by over-sampling.

The $\Delta\Sigma$ modulator 2 as $\Delta\Sigma$ modulating means produces a binary PDM (pulse density modulated) signal, i.e., a one-bit digital audio signal based on the sample values. The $\Delta\Sigma$ modulator 2 converts a 16-bit PCM (pulse code modulated) digital audio signal into a one-bit digital audio signal and compresses data.

The switching circuit 4 as first switching means switches the direction of applying a constant voltage output from the constant voltage source 3 based on the binary PDM signal. By switching the direction of applying the constant voltage, the flow of a current through the voice coil 5 in a speaker 6 is controlled and a diaphragm 7 in the speaker 6 is driven. In a practical circuit, the switching circuit 4 is formed by a high-speed electronic switch using an FET (field effect transistor) and a thyristor.

Figure 2:
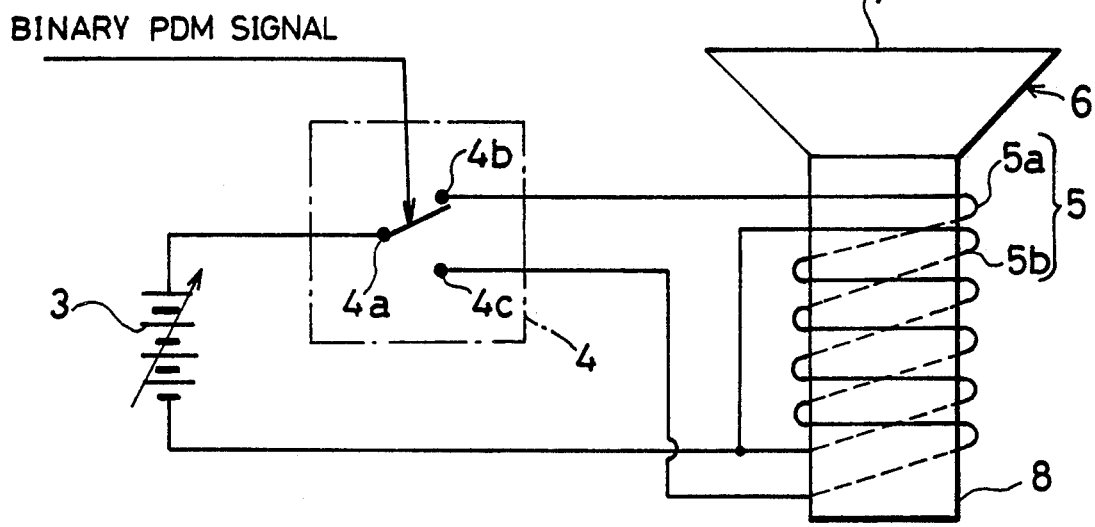
FIG. 2 is a circuit diagram illustrating the structure of a switching circuit and the connections between the switching circuit and the voice coil in the speaker driving device of the first embodiment of the present invention.

As illustrated in FIG. 2, the voice coil 5 is formed by a pair of first and second voice coils 5a and 5b and placed so as to cross a direct current magnetic field generated by a magnetic circuit, not shown, in the speaker 6. The first and second voice coils 5a and 5b are fixed in parallel around a coil bobbin 8 in the speaker 6. Meanwhile, the switching circuit 4 has a fixed terminal 4a and contacts 4b and 4c.

The fixed terminal 4a is connected to the positive terminal of the constant voltage source 3. The contact 4b as the first contact is connected to the first end of the first voice coil 5a pulled from an edge of the coil bobbin 8 adjacent to the diaphragm 7. The contact 4c as the second contact is connected to the second end of the second voice coil 5b pulled from the other edge of the coil bobbin 8 distant from the diagram 7. The second end of the first voice coil 5a located at the same side as the second end of the second voice coil 5b and the first end of the second voice coil 5b located at the same side as the first end of the first voice coil 5a are respectively connected to the negative terminal of the constant voltage source 3.

The switching circuit 4 with such a configuration is capable of controlling the fixed terminal 4a to be connected to the contact 4c or the contact 4b according to a binary PDM signal. Namely, when the binary PDM signal is 1, the contact 4b is connected to the fixed terminal 4a. Meanwhile, when the binary PDM signal is 0, the contact 4c is connected to the fixed terminal 4a.

With this arrangement, the digital audio signal is over-sampled by the digital low-pass filter 1 and $\Delta\Sigma$-modulated by the $\Delta\Sigma$ modulator 2 for noise-shaping. As a result, the PCM digital audio signal becomes a binary PDM signal whose pulse density corresponds to the amplitude of the original audio signal.

When the binary PDM signal is 1, the contact 4b is connected to the fixed terminal 4a in the switching circuit 4. Then, the constant voltage from the constant voltage source 3 is applied to the first voice coil 5a and therefore a current flows through the first voice coil 5a. Consequently, a driving force acting in one direction is generated according to Fleming's left-hand rule, and the coil bobbin 8 is driven by the driving force.

When the binary PDM signal is 0, the contact 4c is connected to the fixed terminal 4a in the switching circuit 4. Then, the constant voltage is applied to the second voice coil 5b and the current flows through the second voice coil 5b in a direction opposite to the direction in which the current flows through the first voice coil 5a. As a result, a driving force acting in the reverse direction is generated, and the coil bobbin 8 is driven by the driving force.

The speaker 6 is driven in proportion to the original audio signal since the diaphragm 7 functions as an acoustic low-pass filter. Thus, sound is reproduced by simply applying the constant voltage to the voice coil 5a or 5b based on the binary PDM signal.

As described above, the speaker driving device of this embodiment includes the pair of first and second voice coils 5a and 5b and drives the coil bobbin 8 in two directions opposite to each other by causing the driving current to flow in the opposite directions in the voice coils 5a and 5b. This arrangement enables the speaker to generate a stronger driving force compared with a conventional speaker driving device which generates a driving force acting in only one direction according to a binary PDM signal. The speaker 6 is thus driven more efficiently.

Additionally, in this speaker, since the driving direction is switched by simply changing the direction of applying the constant voltage between the first voice coil 5a and the second voice coil 5b, it is possible to simplify the structure of the switching circuit 4.

Figure 4:
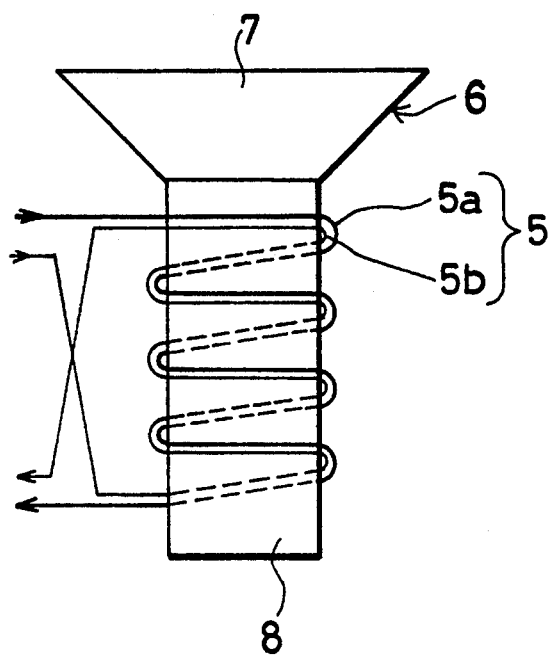
FIG. 4 is a front view illustrating how the voice coils in the speaker driving devices shown in FIGS. 2 and 3 are wound.

Furthermore, as illustrated in FIG. 4, in the speaker driving device, its driving system is constituted by simply winding in the same direction the first and second voice coils 5a and 5b around the boil bobbin 8, connecting the first end of the second voice coil 5b to the constant voltage source 3 while pulling it toward the second end of the first voice coil 5a, and by connecting the second end of the second voice coil 5b to the switching circuit 4 while pulling it toward the first end of the first voice coil 5a. Therefore, the manufacturing process are not caused to be complicated. Additionally, it is also possible to pull the ends of the first voice coil 5a and connect them to the constant voltage source 3 and the switching circuit 4, respectively, in the manner described above.

Next, the second embodiment of the present invention is discussed below with reference to FIGS. 1, 3 and 4. The members having the same functions as in the aforementioned embodiment will be designated with the same reference numerals and their description is omitted.

As illustrated in FIG. 1, a speaker driving device of this embodiment includes a switching circuit 11 instead of the switching circuit 4.

Figure 3:
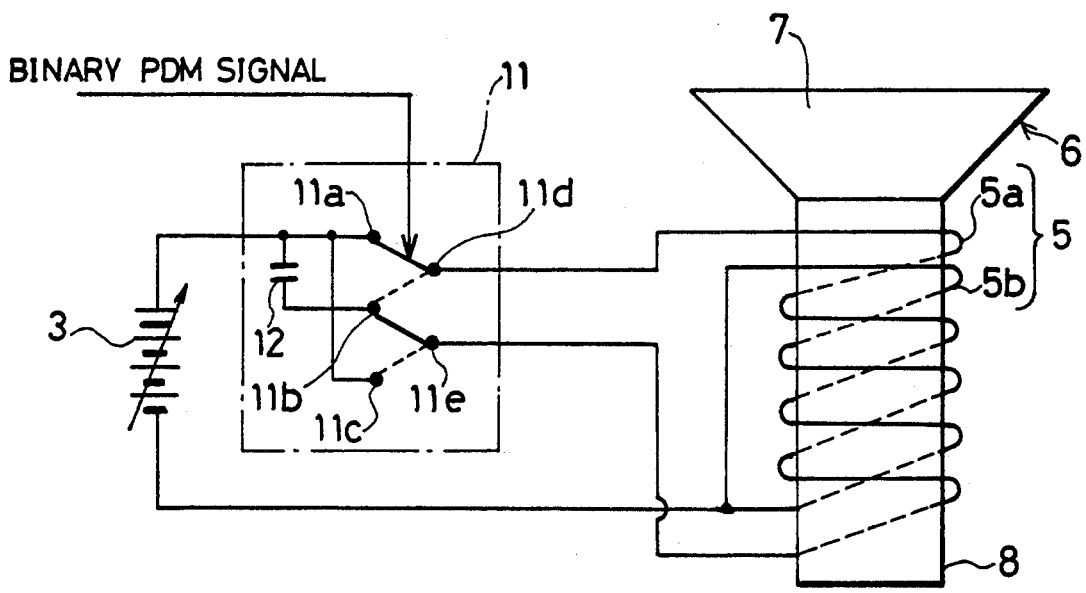
FIG. 3 is a circuit diagram illustrating the structure of a switching circuit and the connections between the switching circuit and the voice coil in the speaker driving device of the second embodiment of the present invention.

The switching circuit 11 as second switching means is a double-pole double-throw switch as illustrated in FIG. 3 and is formed by a high-speed electronic switch like the switching circuit 4 of the above-mentioned embodiment. The switching circuit 11 includes contacts, 11a to 11c, fixed terminals 11d and 11e, and a capacitor 12.

The contact 11a as a first contact and the contact 11c as a second contact are connected to the positive terminal of the constant voltage source 3, and the contact 11b as a third contact is connected to the positive terminal thereof via the capacitor 12 as direct current blocking means. The fixed terminal 11d as a first fixed terminal is connected to the first end of the first voice coil 5a, while the fixed terminal 11e as a second fixed terminal is connected to the second end of the second voice coil 5b. The second end of the first voice coil 5a and the first end of the second voice coil 5b are respectively connected to the negative terminal of the constant voltage source 3.

The switching circuit 11 with such a configuration switches the connections between the contacts, 11a to 11c, and the fixed terminals, 11d and 11e by the binary PDM signal. More specifically, when the binary PDM signal is 1, the contact 11a is connected to the fixed terminal 11d and the contact 11b is connected to the fixed terminal 11e. Meanwhile, when the binary PDM signal is 0, the contact 11b is connected to the fixed terminal 11d and the contact 11c is connected to the fixed terminal 11e.

With this configuration, when the binary PDM signal from the ΔΣ modulator 2 is 1, the constant voltage from the constant voltage source 3 is applied to the first voice coil 5a and a current flows through the first voice coil 5a. On the other hand, when the binary PDM signal is 0, the constant voltage is applied to the second voice coil 5b and the current flows through the second voice coil 5b in a direction opposite the direction in which the current flows through the first voice coil 5a. Therefore, the coil bobbin 8 is driven in a direction corresponding to 1 or 0 of the binary PDM signal, and sound is reproduced.

At this time, due to the effect of alternating current components such as noise components in the constant voltage from the constant voltage source 3, a noise current is superimposed on a current flowing through one of the first and second voice coils 5a and 5b when the constant voltage is being applied to the voice coil. Thus, the driving force for driving the coil bobbin 8 fluctuates due to the alternating components. However, by causing a current which offsets the fluctuation in the driving force to flow through the other voice coil 5a or 5b, it is possible to prevent the effect of the alternating current components.

For example, when the binary PDM signal is 1 and when the constant voltage is applied to the first voice coil 5a, alternating current components including noise components produced by removing direct current components from the constant voltage in the capacitor 12 are applied to the second voice coil 5b. As a result, a noise current flows through the second voice coil 5b in a direction opposite to the direction in which the current flows through the first voice coil 5a, producing a driving force of a polarity opposite to the polarity of the main driving force generated by the first voice coil 5a.

On the other hand, when the binary PDM signal is 0, the noise current flows through the first voice coil 5a, producing a driving force of a polarity opposite to the polarity of the main driving force generated by the second voice coil 5b. Consequently, the driving force generated by the alternating current components is removed from the main driving force and the coil bobbin 8 is thus driven by a driving force generated by the direct current components of the constant voltage.

As described above, similar to the first embodiment, in the speaker driving device of this second embodiment, the coil bobbin 8 is driven in two opposite directions by causing the driving current to flow through the first and second voice coils 5a and 5b in the opposite directions, improving the driving efficiency.

Additionally, the first and second voice coils 5a and 5b are easily fixed around the coil bobbin 8 as illustrated in FIG. 4, preventing the manufacturing process to be complicated.

Furthermore, in this speaker driving device, by causing the noise current to flow through one of the first and second voice coils 5a and 5b to which no constant voltage is applied, the effect of the noise components in the constant voltage upon the main driving force is eliminated. It is thus possible to prevent the noise components from causing noise and distortion in the reproduction of sound.

With the speaker driving devices of the first and the second embodiments, the speaker 6 is driven by a driving force proportional to the applied constant voltage. Therefore, the volume of the reproduced sound is adjusted by changing the value of the voltage of the constant voltage source 3.

Figure 5:
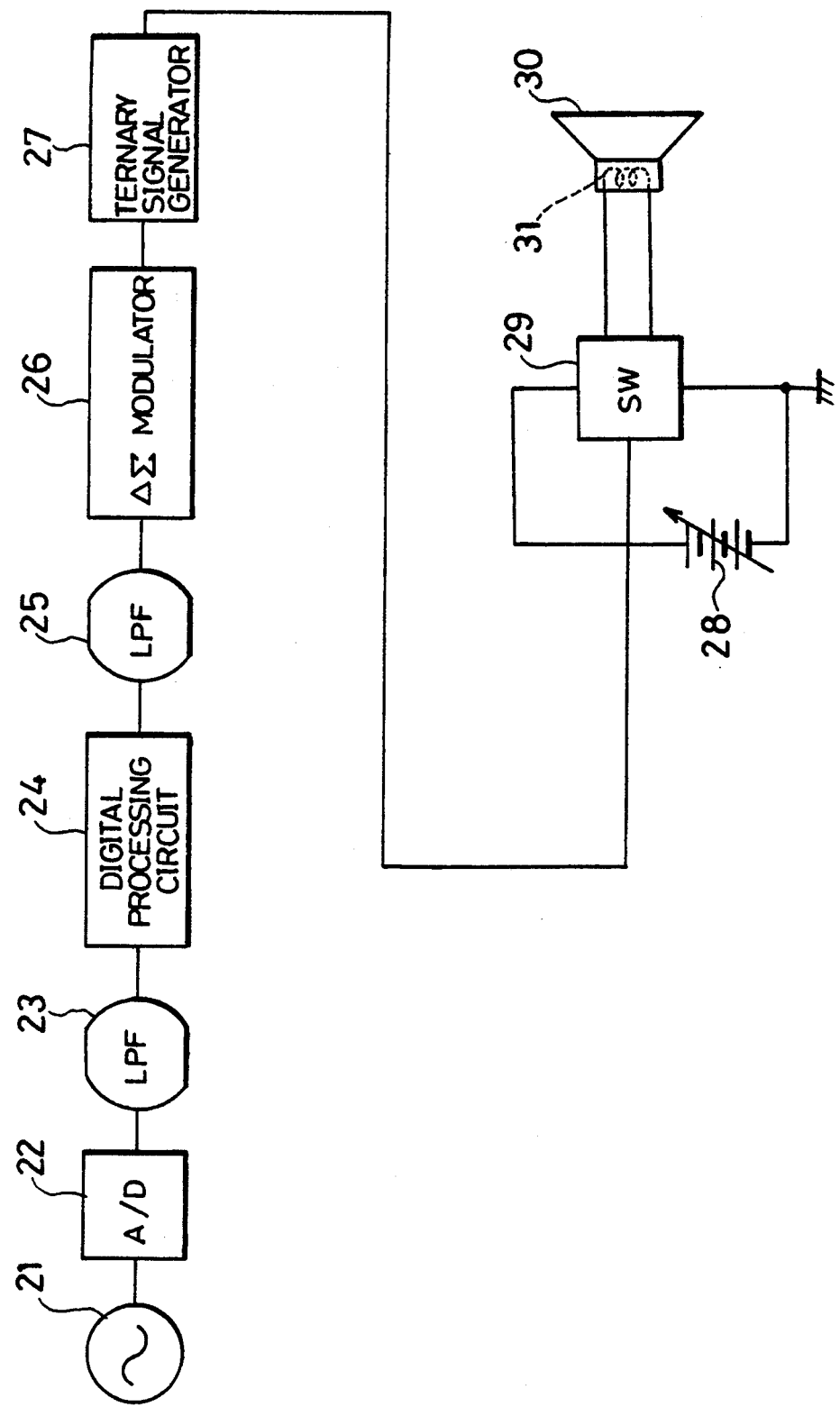
FIG. 5 is a block diagram schematically illustrating the structure of a speaker driving device according to the third embodiment of the present invention.
Figure 7:
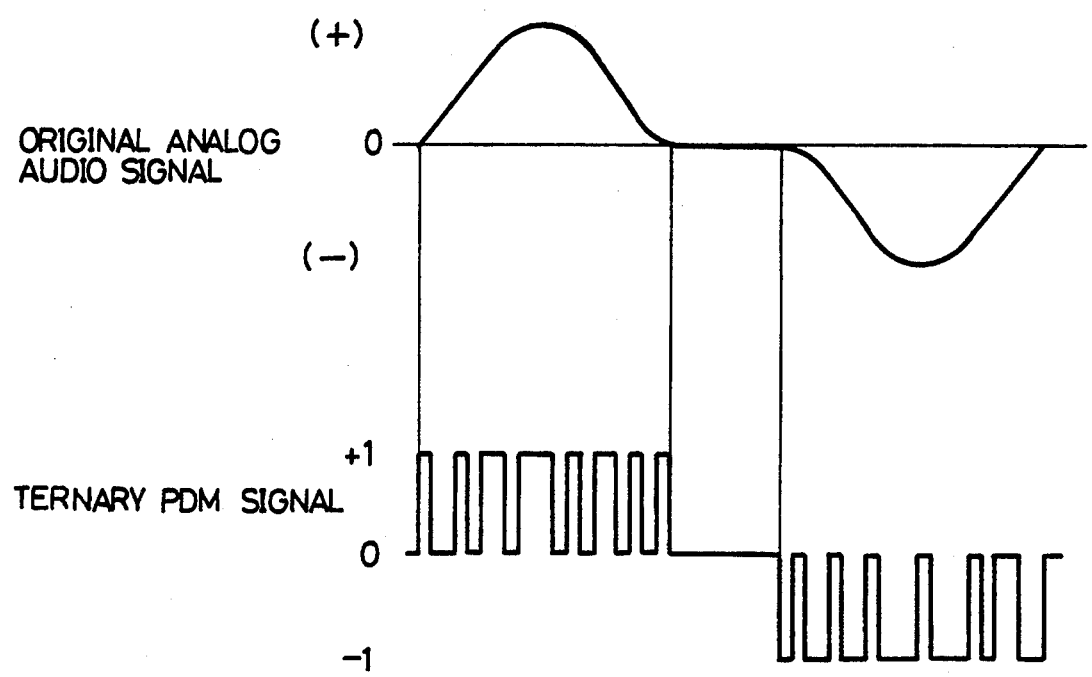
FIG. 7 illustrates the waveforms of an original audio signal and a ternary PDM signal generated by the speaker driving devices shown in FIGS. 5 and 6.
Figure 8:
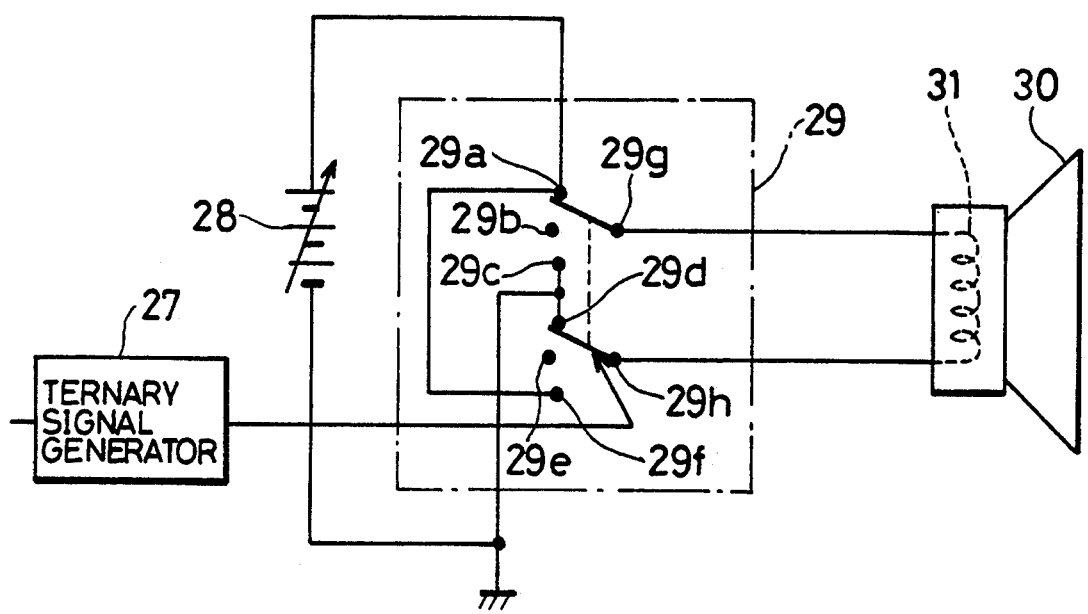
FIG. 8 is a circuit diagram illustrating the structure of the switching circuits in the speaker driving device shown in FIGS. 5 and 6.

The following description discusses the third embodiment of the present invention with reference to FIGS. 5, 7 and 8.

As illustrated in FIG. 5, a speaker driving device of this embodiment incorporates an analog audio signal source 21, an A/D converter 22 (designated as A/D in the drawing), a digital low-pass filter (LPF) 23, a digital processing circuit 24, a digital low-pass filter (LPF) 25, a ΔΣ modulator 26, a ternary signal generator 27, a constant voltage source 28, and a switching circuit (SW) 29.

The A/D converter 22 converts an analog audio signal transmitted from the analog audio source 21 into a PCM digital audio signal by a 16-bit quantization and at a 48-kHz sampling frequency. In the digital processing circuit 24, the PCM digital audio signal sent from the A/D converter 22 via the digital low-pass filter 23 is processed by performing transmitting, memorizing and digital equalizing operations.

In order to move folded noise components to higher frequency ranges, the digital low-pass filter 25 oversamples the PCM digital audio signal at a high sampling frequency. The ΔΣ modulator 26 as ΔΣ modulating means generates a binary PDM signal (a one-bit digital audio signal) based on sample values produced by oversampling.

The ternary signal generator 27 as ternary signal generating means generates a ternary (+1, 0 or −1) PDM signal (hereinafter referred to as just ternary signal) based on the binary PDM signal (hereinafter referred to as just binary signal) by calculating the following equation (1).

$$D_3(T) = D_2(T-\Delta T) + D_2(T) - 1 \tag{1}$$

where $D_2(T)$ represents a binary signal at time T, $D_3(T)$ a ternary signal at time T, and $\Delta T$ is a sampling period in over-sampling.

The following description discusses the generation of ternary signal according to equation (1).

Figure 10:
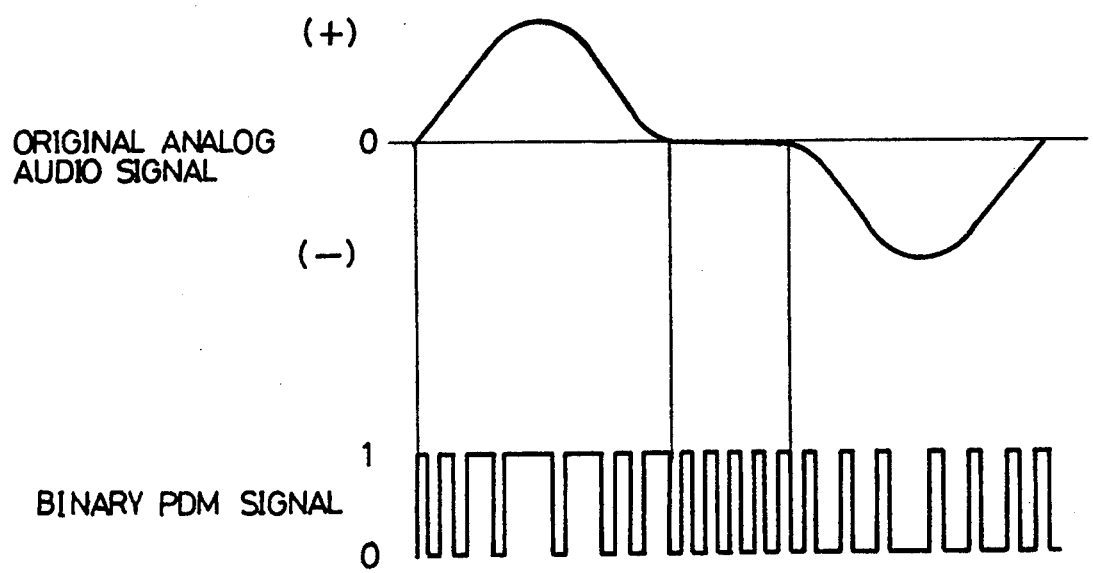
FIG. 10 illustrates the waveforms of the original audio signal and a binary PDM signal.

When the signal level of the original audio signal is positive, two successive binary signals $D_2(T-\Delta T)$ and $D_2(T)$ are 1 and 0, 0 and 1, or 1 and 1 due to the above-mentioned feature of a binary signal (see FIG. 10), while $D_3(T)$ is 0 or +1 according to equation (1).

When the signal level of the original analog audio signal is 0, two successive binary signals are 1 and 0, or 0 and 1, while $D_3(T)$ is 0 according to equation (1).

In contrast, when the signal level of the original analog audio signal is negative, two successive binary signals are 1 and 0, 0 and 1, or 0 and 0, while $D_3(T)$ is 0 or −1 according to equation (1).

The ternary signal thus obtained qualitatively has the following characteristic (see FIG. 7).

(1) In the case where the level of the original analog audio signal is positive, as the level becomes higher, the frequency that the ternary PDM signal becomes +1 increases.

(2) When the level of the original analog audio signal is zero, the ternary signal becomes zero.

(3) In the case where the level of the original analog audio signal is negative, as the level becomes lower, the frequency that the ternary PDM signal becomes −1 increases.

The switching circuit 29 as third switching means is designed to control the application of the constant voltage from the constant voltage source 28 based on the ternary signal and to apply the constant voltage intermittently to a voice coil 31 in a speaker 30. In a practical circuit, the switching circuit 29 is formed by a high-speed electronic switch using FETs and thyristors.

As illustrated in FIG. 8, the switching circuit 29 is a double-pole double-throw switch and has contacts, 29a to 29f, and fixed terminals 29g and 29h. The contacts 29a and 29f as first contacts are connected to the positive terminal of the constant voltage source 28, while the contact 29c and 29d as second contacts are connected to the negative terminal of the constant voltage source 28. The contacts 29b and 29e as third contacts are open. The fixed terminal 29g as a first fixed terminal and the fixed terminal 29h as a second fixed terminal are connected to the ends of the voice coil 31, respectively.

The switching circuit 29 with such a configuration switches the connections between the fixed terminals, 29g and 29h, and the contacts, 29a to 29f, in accordance with the ternary signal. More specifically, when the ternary signal is +1, the contacts 29a and 29d are connected to the fixed terminals 29g and 29h, respectively. When the ternary signal is 0, the contacts 29b and 29e are connected to the fixed terminals 29g and 29h, respectively. Meanwhile, when the ternary signal is −1, the contacts 29c and 29f are connected to the fixed terminals 29g and 29h, respectively.

With this configuration, a digital audio signal over-sampled by the digital low-pass filter 25 is $\Delta\Sigma$-modulated for noise-shaping by a $\Delta\Sigma$ modulator 26. As a result, a binary signal is obtained. The ternary signal generator 27 converts the binary signal into a ternary signal with a pulse density corresponding to the amplitude of the original analog audio signal as illustrated in FIG. 7. The switching circuit 29 controls the connections between the constant voltage source 28 and the voice coil 31 according to the ternary signal.

When the ternary signal is +1, the contacts 29a and 29d are connected to the fixed terminal 29g and 29h, respectively, and the constant voltage is applied to the voice coil 31 so that the electric potential at the fixed terminal 29g becomes higher than that at the fixed terminal 29h. As a result, a current flows and a driving force acting in one direction is generated. The vibrating system of the speaker 30 is driven by the driving force.

When the ternary signal is 0, the contacts 29b and 29e are connected to the fixed terminals 29g and 29h, respectively. Therefore, the constant voltage is not applied to the voice coil 31 and no current flows. In consequence, the vibrating system of the speaker 30 is not driven and sound is not reproduced.

When the ternary signal is −1, the contacts 29c and 29f are connected to the fixed terminal 29g and 29h, respectively, and the constant voltage is applied to the voice coil 31 so that the electric potential at the fixed terminal 29h becomes higher than that at the fixed terminal 29g. As a result, a current flows in a direction opposite to the direction in which the current flows when the ternary signal is +1, and a driving force for driving the vibrating system in the opposite direction is generated.

Since the driving force is generated in proportion to the original analog audio signal, the speaker 30 reproduces a sound. At this time, if the vibrating system of the speaker 30 sets the upper limit of the reproduction band below the audible band, the vibrating system functions as a low-pass filter which is located after a D/A converter in a speaker driving device in which a digital audio signal is converted into an analog audio signal. Therefore, it is possible to reproduce the analog audio signal by simply inputting into the speaker 30 the current controlled by the ternary signal without incorporating such an analog low-pass filter into an electric circuit.

Additionally, when the original analog audio signal is 0, the ternary signal is 0 due to the characteristic of a ternary signal. Thus, the speaker 30 does not consume any power when no signal is input. As s result, the speaker driving device of this embodiment performs more power efficient driving compared to a conventional speaker driving device which drives the speaker 30 according to a binary signal. Moreover, since the speaker of this embodiment generates a driving force acting on two directions, opposite to each other, corresponding to +1 and −1 of the ternary signal, the speaker 30 is driven more efficiently compared to a conventional speaker driving device which generates a driving force acting only in one direction according to a binary signal.

Furthermore, in the speaker driving device of this embodiment, the volume of the reproduced sound is adjusted by varying the constant voltage to be applied to the voice coil 31 at the constant voltage source 28. The volume is also adjusted by varying the time interval $\tau$ at which the constant voltage is applied to the voice coil 31 within the range $0 < \tau < \Delta T$.

More specifically, the time interval $\tau$ is varied by arranging the $\Delta\Sigma$ demodulator 26 such that the duty ratio of pulses controlling whether to apply the constant voltage is variable. With this arrangement, since the electric power to be supplied to the speaker 30 becomes greater as the time interval $\tau$ increases, the volume of sound is turned up.

Next, the fourth embodiment of the present invention is discussed below with reference to FIGS. 6 through 9.

The members having the same functions as in the aforementioned embodiment will be designated with the same reference numerals and their description is omitted.

Figure 6:
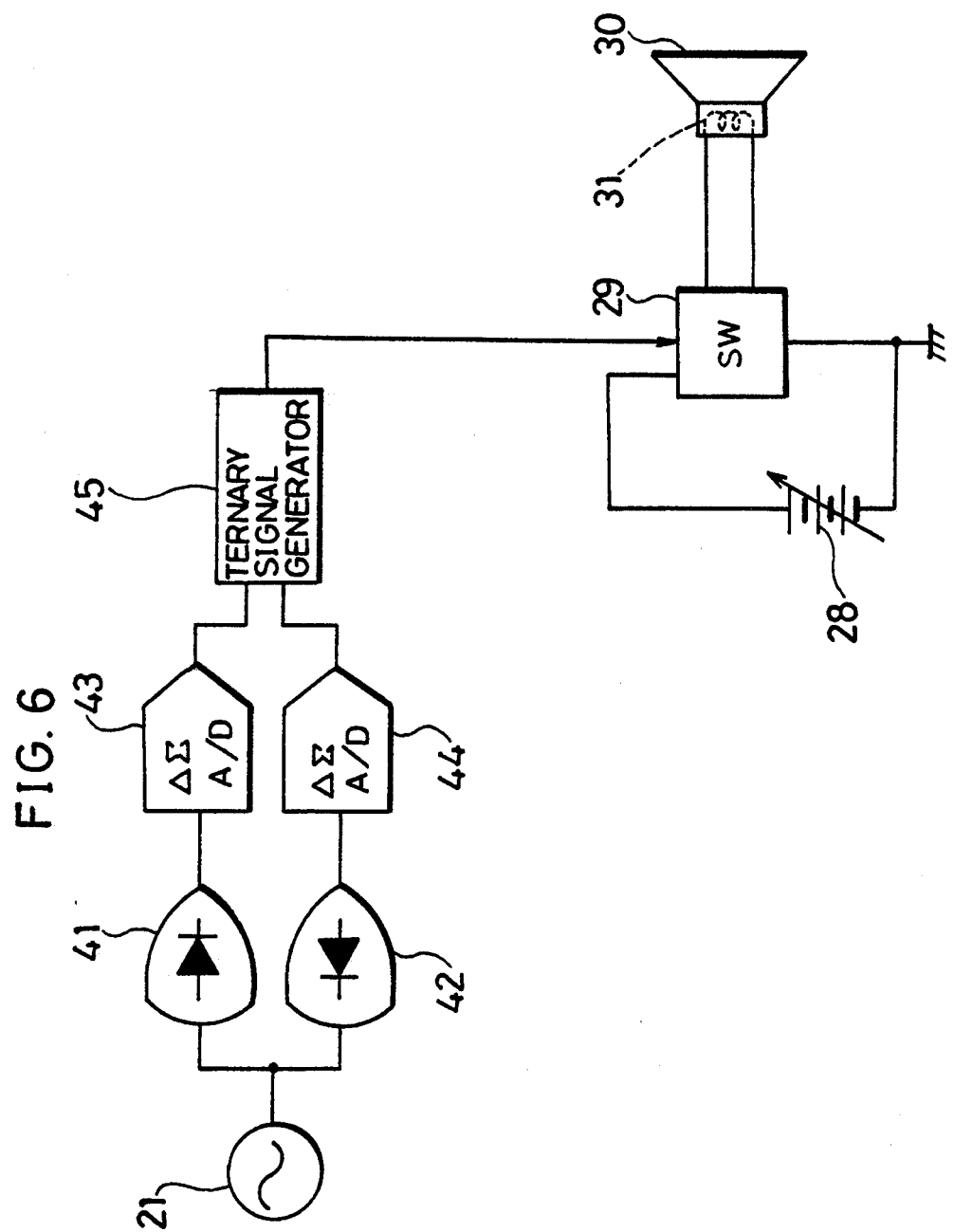
FIG. 6 is a block diagram schematically illustrating the structure of a speaker driving device according to the fourth embodiment of the present invention.

As illustrated in FIG. 6, a speaker driving device of this embodiment has an analog audio signal source 21, rectifiers 41 and 42, ΔΣ-modulation A/D converters 43 and 44 (designated as ΔΣ A/D in the drawing), a ternary signal generator 45, a constant voltage source 28, and a switching circuit 29.

The rectifiers 41 and 42 are circuits for rectifying an analog audio signal output from the analog audio signal source 21, and separate positive and negative portions of the analog audio signal.

The ΔΣ-modulation A/D converters 43 and 44 as ΔΣ modulating means are one-bit A/D converters, and separately convert each of the positive and negative analog audio signals output from the rectifiers 41 and 42 into a binary signal (one-bit digital audio signal) by high-speed sampling ΔΣ-modulation.

The ternary signal generator 45 as ternary signal generating means produces a ternary signal from the binary signals output from the ΔΣ-modulation A/D converters 43 and 44 by calculating equation (2)

$$D_3(T) = D_P(T) + D_M(T) - 1 \quad (2)$$

where $D_P(T)$ and $D_M(T)$ are the binary signals produced by the ΔΣ-modulation A/D converters 43 and 44 at time T, and $D_3(T)$ is a ternary signal produced by the ternary signal generator 45 at time T.

The following description discusses the generation of a ternary signal according to equation (2).

$D_P(T)$ is a binary signal produced from a positive rectified signal of FIG. 9(b) representing a positive portion of the original analog audio signal of FIG. 9(a) by the ΔΣ-modulation A/D converter 43. Meanwhile, $D_M(T)$ is a binary signal produced from a negative rectified signal of FIG. 9(c) representing a negative portion of the original analog audio signal by the ΔΣ-modulation A/D converter 44.

The positive rectified signal has a value higher than a minimum value of the dynamic range because the zero level of the original analog audio signal becomes the minimum level, for example 0, when the ΔΣ-modulation A/D converter 43 performs A/D conversion. On the other hand, the negative rectified signal has a value lower than a maximum value of the dynamic range because the zero level of the original analog audio signal becomes the maximum level when the ΔΣ-modulation A/D converter 44 performs A/D conversion.

Therefore, when the signal level of the original analog audio signal is positive, the frequency that $D_M(T)$ becomes 1 significantly increases, and $D_3(T)$ has the same value as $D_P(T)$, namely 0 or +1, according to equation (2). For example, since the frequency that $D_P(T)$ becomes +1 is high in the vicinity of time $T_0$ where the amplitude of the original analog audio signal becomes substantially maximum, the frequency that $D_3(T)$ becomes +1 is also high.

When the signal level of the original analog audio signal is zero, the frequency that $D_P(T)$ becomes 0 and the frequency that $D_M(T)$ becomes 1 respectively increase. As a result, $D_3(T)$ becomes 0 according to equation (2).

On the contrary, when the signal level of the original analog audio signal is negative, the frequency that $D_P(T)$ becomes 0 increases, and $D_3(T)$ has the same value as $D_M(T)$, namely 0 or −1, according to equation (2).

The ternary signal thus obtained is input to the switching circuit 29 as shown in FIG. 8, and functions as a control signal which changes the connections between the constant voltage source 28 and the voice coil 31 in the same manner as in the speaker driving device of the third embodiment.

With this arrangement, the rectifiers 41 and 42 rectify the analog audio signal output from the analog audio signal source 21 so as to separate its positive and negative portions. The rectified signals are separately converted into binary signals by the ΔΣ-modulation A/D converters 43 and 44. The ternary signal generator 45 produces a ternary signal from the two binary signals output from the ΔΣ-modulation A/D converters 43 and 44. Then, the switching circuit 29 changes the connections between the constant voltage source 28 and the voice coil 31 according to the ternary signal.

When the ternary signal is +1, a constant voltage is applied to the voice coil 31 so that the electric potential at the fixed terminal 29g becomes higher than that at the fixed terminal 29h, and a current flows through the voice coil 31 in one direction. When the ternary signal is 0, the constant voltage is not applied to the voice coil 31 and therefore no current flows through the voice coil 31. When the ternary signal is −1, the constant voltage is applied to the voice coil 31 so that the electric potential at the fixed terminal 29h becomes higher than that at the fixed terminal 29g, and the current flows through the voice coil 31 in the opposite direction. By causing the current to flow through the voice coil 31 in such a manner, the speaker 30 produces a driving force proportional to the original analog audio signal and reproduces a sound.

As described above, by the characteristic of a ternary signal, like the speaker driving device of the third embodiment, the speaker driving device of this embodiment achieves improved power efficiency and drives the speaker 30 more efficiently. Additionally, this speaker driving device is capable of adjusting the volume of sound by varying the constant voltage at the constant voltage source 28 or varying the above-mentioned time interval τ. Time interval τ is varied by arranging the ΔΣ-modulation A/D converters 43 and 44 such that the duty ratio of the pulses controlling whether to apply the constant voltage becomes variable.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A speaker driving device comprising:
a pair of voice coils, said pair being formed by a first voice coil and a second voice coil, said first and second voice coils being wound around a driving section of a speaker to generate a bi-directional driving force at said driving section when a current flows through said first and second voice coils in opposite directions;
a constant voltage source for generating a constant voltage;
delta sigma modulating means responsive to a multi-bit digital audio signal for producing a one-bit binary digital audio pulse density modulated (PDM) signal by high-speed sampling delta sigma modulation; switching means for alternatively applying the constant voltage to said first voice coil or said second voice coil directly responsive to said one-bit distal audio PDM signal so as to cause the current to flow through said first and second voice coils in opposite directions, said speaker functioning as an acoustic low-pass filter;

wherein said switching means includes:
    a fixed terminal connected to a positive terminal of said constant voltage source;
    a first contact connected to a first end of said first voice coil; and
    a second contact connected to a second end of said second voice coil located at the same side as a second end of said first voice coil; and
    said switching means connects said fixed terminal to said first contact when said one-bit digital audio PDM signal is 1, connects said fixed terminal to said second contact when said one-bit digital audio PDM signal is 0, and
    wherein said second end of said first voice coil and a first end of said second voice coil are connected to a negative terminal of said constant voltage source, said first end of said second voice coil and said first end of said voice coil are pointing to the same direction.

2. The speaker driving device according to claim 1, wherein said first and second voice coils are wound in parallel around said driving section and connected to said switching means so that the constant voltage is applied to said first voice coil in one direction and the constant voltage is applied to said second voice coil in the reverse direction, and wherein said switching means includes an electronic switch for alternatively connecting said constant voltage source and one of said first and second voice coils based on a binary number (1 or 0) of said one-bit digital audio PDM signal.

3. The speaker driving device according to claim 1, wherein the output voltage of said constant voltage source is selectively varied to produce a selected constant output voltage, whereby the volume of reproduced sound is adjusted.

4. A speaker driving device comprising:
a pair of voice coils, said pair being formed by a first voice coil and a second voice coil, said first and second voice coils being fixed around a driving section of a speaker to generate a bi-directional driving force at said driving section when a current flows through said first and second voice coils in opposite directions;
a voltage source for generating a substantially constant voltage having direct current and alternating current components;
direct current blocking means for blocking a direct current component of the substantially constant voltage;
delta sigma modulating means responsive to a multi-bit digital audio signal for producing a one-bit binary digital pulse density modulated (PDM) signal by high-speed sampling delta sigma modulation; and
switching means for alternatively applying the direct current component of the substantially constant voltage to one of said first and second voice coils and the alternating current component from said direct current blocking means to the other voice coil directly responsive to said one-bit digital audio PDM signal so as to cause the current to flow through said first and second voice coils in opposite directions, said speaker functioning as an acoustic low-pass filter.

5. The speaker driving device according to claim 4, wherein said first and second voice coils are wound in parallel around said driving section and connected to said switching means so that the substantially constant voltage is applied to said first voice coil in one direction and the substantially constant voltage is applied to said second voice coil in the reverse direction, and wherein said switching means includes an electronic switch for changing the connections among said pair of voice coils, said substantially constant voltage source and said direct current blocking means by alternatively connecting said substantially constant voltage source and one of said first and second voice coils and connecting said direct current blocking means and the other voice coil based on a binary number of said one-bit digital audio PDM signal.

6. The speaker driving device according to claim 4, wherein said switching means includes:
first and second contacts connected to a positive terminal of said substantially constant voltage source;
a third contact connected to the positive terminal of said substantially constant voltage source through said direct current blocking means;
a first fixed terminal connected to a first end of said first voice coil; and
a second fixed terminal connected to a second end of said second voice coil located at the same side as a second end of said first voice coil, and
said switching means connects said first fixed terminal to said first contact and connects said second fixed terminal to said third contact when said one-bit digital audio PDM signal is 1, and connects said first fixed terminal to said third contact and connects said second fixed terminal to said second contact when said one-bit digital audio PDM signal is 0,
and
wherein said second end of said first voice coil and a first end of said second voice coil are connected to a negative terminal of said substantially constant voltage source, said first end of said second voice coil being located at the same side as said first end of said first voice coil.

7. The speaker driving device according to claim 4, wherein said direct current blocking means includes a capacitor.

8. The speaker driving device according to claim 4, wherein said substantially constant voltage source has a selectively variable output voltage, whereby the volume of reproduced sound is adjusted.

9. A speaker driving comprising:
a constant voltage source for generating a voltage to be applied to a voice coil in a speaker;
delta sigma modulating means responsive to a multi-bit digital audio signal for producing a one-bit binary digital audio pulse density modulated (PDM) signal by high-speed sampling delta sigma-modulation;

ternary signal generating means for producing a ternary signal from said one-bit digital audio PDM signal; and switching means for switching the polarity of the constant voltage as applied to the speaker depending on whether the ternary signal is +1 or −1 and for controlling the application of the constant voltage to said voice coil by switching said constant voltage source between on and off according to an absolute value of said ternary signal, the absolute value being either 0 or 1, said speaker functioning as an acoustic low-pass filter.

10. The speaker driving device according to claim 9, wherein said switching means includes an electronic switch for controlling the constant voltage to be applied in one direction to said voice coil when the ternary signal is +1 and to be applied in the opposite direction to said voice coil when the ternary signal is −1, and for stopping the application of the constant voltage to said voice coil when the ternary signal is 0.

11. The speaker driving device according to claim 10, wherein said switching means includes:
   first and second terminals connected to said voice coil;
   a first contact connected to a positive terminal of said constant voltage source;
   a second contact connected to a negative terminal of said constant voltage source; and
   a third contact which is open, and
   said switching means connects said first terminal to said first contact and connects said second terminal to said second contact when said ternary signal is +1, connects said first terminal to said second contact and connects said second terminal to said first contact when said ternary signal is −1, and connects at least one of said first and second terminals to said third contact when said ternary signal is 0.

12. The speaker driving device according to claim 9, wherein said constant voltage source has a selectively variable output voltage, whereby the volume of reproduced sound is adjusted.

13. The speaker driving device according to claim 9, wherein said delta sigma modulating means outputs pulses having a variable duty ratio for controlling the time interval during which the constant voltage in a sampling period is applied for high-speed sampling, whereby the volume of reproduced sound is adjusted.

14. The speaker driving device comprising:
a constant voltage source for generating a constant voltage to be applied to a voice coil in a speaker;
delta sigma modulating memos responsive to analog audio signals for separately producing a one-bit binary distal audio pulse density modulated (PDM) signal representing a positive portion of an original analog audio signal and a one-bit binary digital audio PDM signal representing a negative portion thereof by high-speed sampling delta sigma-modulation;

ternary signal generating means for producing a ternary signal from said two one-bit digital audio PDM signals; and switching means for switching the polarity of the constant voltage as applied to the speaker depending on whether the ternary signal is +1 or −1 and for controlling the application of the constant voltage to said voice coil by switching said constant voltage source between on and off according to an absolute value of said ternary signal, the absolute value being either 0 or 1, said speaker functioning as an acoustic low-pass filter.

15. The speaker driving device according to claim 14, wherein said switching means includes an electronic switch for controlling the constant voltage to be applied in opposite directions to said voice coil when the ternary signal is +1 and −1, respectively, and for stopping the application of the constant voltage to said voice coil when the ternary signal is 0.

16. The speaker driving device according to claim 15, wherein said switching means includes:
   first and second terminals connected to said voice coil;
   a first contact connected to a positive terminal of said constant voltage source;
   a second contact connected to a negative terminal of said constant voltage source; and
   a third contact which is open, and
   said switching means connects said first terminal to said first contact and connects said second terminal to said second contact when said ternary signal is +1, connects said first terminal to said second contact and connects said second terminal to said first contact when said ternary signal is −1, and connects at least one of said first and second terminals to said third contact when said ternary signal is 0.

17. The speaker driving device according to claim 14, wherein said constant voltage source has a selectable variable output voltage, whereby the volume of reproduced sound is adjusted.

18. The speaker driving device according to claim 14, wherein said delta sigma modulating means outputs pulses having a variable duty ratio for controlling the time interval during which the constant voltage in a sampling period is applied for high-speed sampling, whereby the volume of reproduced sound is adjusted.

* * * * *